US007206448B2

(12) United States Patent
Howard

(10) Patent No.: US 7,206,448 B2
(45) Date of Patent: Apr. 17, 2007

(54) SYSTEM AND METHOD FOR USING PATTERN VECTORS FOR VIDEO AND IMAGE CODING AND DECODING

(75) Inventor: Paul Glor Howard, Morganville, NJ (US)

(73) Assignee: AT&T Corp., New York, NY (US)

( * ) Notice: Subject to any disclaimer, the term of this patent is extended or adjusted under 35 U.S.C. 154(b) by 565 days.

(21) Appl. No.: 10/086,102

(22) Filed: Feb. 28, 2002

(65) Prior Publication Data

US 2003/0161405 A1   Aug. 28, 2003

(51) Int. Cl.
*G06K 9/00* (2006.01)

(52) U.S. Cl. .................. 382/170; 382/232; 382/250; 382/251; 375/240.03; 375/240.23

(58) Field of Classification Search ........... 382/232, 382/245–248, 239, 250–251, 170, 194; 375/240.03, 375/240.23; 348/395.1, 403.1, 404.1, 407.1, 348/408.1; 358/426.01, 426.07, 426.16
See application file for complete search history.

(56) References Cited

U.S. PATENT DOCUMENTS

| | | | | |
|---|---|---|---|---|
| 5,367,629 | A | * | 11/1994 | Chu et al. ............... 382/253 |
| 5,740,283 | A | * | 4/1998 | Meeker ................... 382/248 |
| 6,061,398 | A | | 5/2000 | Satoh et al. |
| 6,249,546 | B1 | * | 6/2001 | Bist ..................... 375/240.03 |
| 6,542,640 | B1 | * | 4/2003 | Morihara et al. ........ 382/229 |
| 6,696,993 | B2 | * | 2/2004 | Karczewicz ............... 341/67 |
| 6,856,701 | B2 | * | 2/2005 | Karczewicz et al. ...... 382/247 |
| 2002/0025000 | A1 | * | 2/2002 | Takeuchi et al. ...... 375/240.12 |
| 2003/0067979 | A1 | * | 4/2003 | Takahashi et al. ..... 375/240.03 |
| 2003/0081850 | A1 | * | 5/2003 | Karczewicz et al. ...... 382/247 |
| 2003/0118243 | A1 | * | 6/2003 | Sezer et al. ............... 382/245 |
| 2003/0123743 | A1 | * | 7/2003 | Zandi et al. ............... 382/240 |
| 2003/0147561 | A1 | * | 8/2003 | Faibish et al. ............ 382/245 |

(Continued)

FOREIGN PATENT DOCUMENTS

WO         06/19045         6/1996

(Continued)

OTHER PUBLICATIONS

Nister D. et al. "An Embedded DCT-Based Still Image Coding Algorithm" IEEE Signal Processing Letters, IEEE Signal Processing Society, Jun. 1, 1998. ISSN: 1070-9908.

(Continued)

*Primary Examiner*—Jingge Wu
*Assistant Examiner*—Ali Bayat

(57) ABSTRACT

An exemplary embodiment of the invention relates to a method of using pattern vectors for image coding and decoding. The method comprises converting a block of image data into a set of transform coefficients, quantizing the transform coefficients such that a number of the coefficients become zero, constructing a single entity or bit vector indicating which coefficients are non-zero, coding the single entity or bit vector as an integer using an adaptive, semi-adaptive or non-adaptive arithmetic coder, coding the values of the coefficients in any fixed order, using an adaptive, semi-adaptive or non-adaptive arithmetic coder, or some other coder, and coding all coefficients except the zero coefficients. The system and method of decoding data relate to the corresponding hardware and process steps performed by the decoder when decoding a bitstream coded as described herein.

11 Claims, 6 Drawing Sheets

U.S. PATENT DOCUMENTS

2003/0190085 A1* 10/2003 Lin et al. ............ 382/250

FOREIGN PATENT DOCUMENTS

WO WO 96/19045 6/1996

OTHER PUBLICATIONS

Gonzales C.A. : "DCT Coding For Motion Video Storage Using Adaptive Arithmetic Coding", Signal Processing, Image Communication, Elsevier Science Publishers, Amsterdam, NL, vol. 2, No. 2, Aug. 1, 1990. ISSN: 0923-5965.

Howard, P.G. et al. "Arithmetic Coding for Data Compression", Proceedings of the IEEE, IEEE. New York, US, vol. 82, No. 6, Jun. 1, 1994. ISSN: 0018-9219.

Kondo H. et al. "Digital Image Compression Using Dircectional Sub-block DCT", Proceedings of 16th International Conference on Communication Technology (ICCT'00), Beijing, China, vol. 1, Aug. 21, 2000.

* cited by examiner

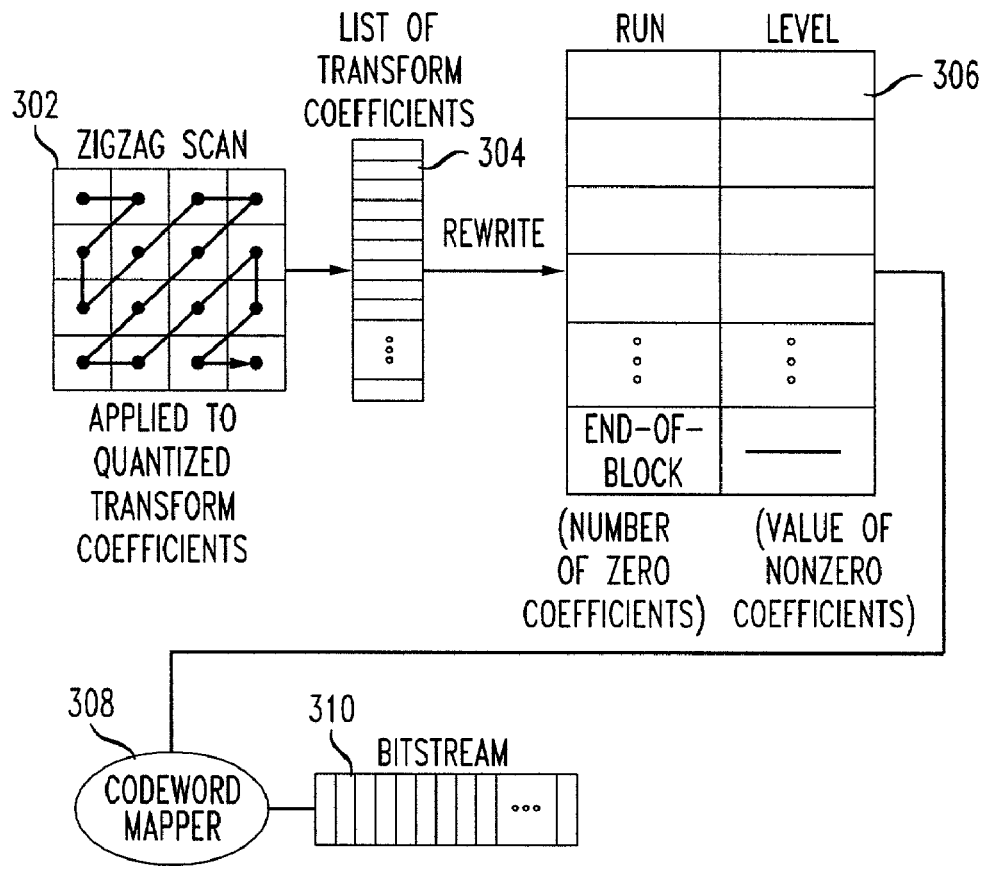

SYSTEM AND METHOD FOR USING PATTERN VECTORS FOR VIDEO AND IMAGE CODING AND DECODING

BACKGROUND OF THE INVENTION

1. Field of the Invention

The present invention relates to a system and method of video compression coding and decoding and particularly to a system and method of using pattern vectors for video and image coding and decoding that eliminates two-dimensional coding of transform coefficients and the requisite zigzag scan order or alternate scan order.

2. Discussion of Related Art

Transform coding is the heart of several industry standards for image and video compression. Transform coding compresses image data by representing samples of an original signal with an equal number of transform coefficients. A sample of the original signal may be the signal itself, or it may be the difference between the signal and a predicted value of the signal, the prediction being done by any of a number of widely-known methods. Transform coding exploits the fact that for typical images a large amount of signal energy is concentrated in a small number of coefficients. Then only the coefficients with significant energy need to be coded. The discrete cosine transform (DCT) is adopted in standards such as the Joint Photographers Expert Group (JPEG) image coding standard, Motion Picture Expert Group (MPEG) video coding standards, ITU-T recommendations H.261 and H.263 for visual telephony, and many other commercially available compression systems based on some variations of these standard transform coding schemes.

Transform coding is a block-based image compression technique in which the input image is partitioned into fixed-size small blocks and each block of pixels is coded independently. FIG. 1, FIG. 2, and FIG. 3 illustrate a standard method of block-based image compression. As shown in FIG. 1, in a typical transform encoder, an input image (101) is partitioned into blocks (102). The blocks are usually square but may be of any rectangular shape, or in fact may be of any shape at all. FIG. 2 illustrates the data 202 in a block is transformed by a sequence of linear operations in the encoder into a set of quantized transform coefficients. A predictor 204 may predict the sample values in the block to yield a predicted block 206. Many such predictors are known in the art. A difference operator 208 computes a difference block 210 representing a difference between the image data 202 and the prediction block 206. A transform operator 212 transforms the difference block 210, typically a discrete cosine transform (DCT), into a set of transform coefficients 214.

If the input block is rectangular, the set of transform coefficients form a rectangular array. The transform coefficients $y_k, 1 \leq k \leq K$, are quantized independently by distinct quantizers 216 to generate a set of indices, referred to as the quantized transform coefficients 218.

FIG. 3 shows that the indices are converted by a predetermined scan order 302, typically one that zigzags through the quantized transform coefficients in increasing frequency order, to produce a list of transform coefficients 304. The list of transform coefficients is rewritten as a set of (run, level) pairs 306. The "run" component of each pair is the count of the number of zero coefficients before the next nonzero coefficient; the "level" component is the value of the next nonzero coefficient. The (run, level) pairs are mapped by a codeword mapper 308 into a sequence of bits 310 that are output to the channel to be transmitted to the decoder.

FIG. 4. shows part of an example mapping between (run, level) pairs 402 and codewords 404. One codeword 406 is reserved to indicate that there are no more nonzero coefficients in the block, i.e., to indicate the end-of-block condition 408.

As shown in FIGS. 2 and 3, the basic process for transform coding includes the following steps: converting a block of image data into an array of transform coefficients (214); quantizing the transform coefficients such that all, some, or none of the coefficients become zero; the zero coefficients are typically the high-frequency coefficients (218); ordering the coefficients in a list according to a fixed order, typically in a zigzag scan ranging over the coefficients from low to high frequency in both the horizontal and vertical dimensions, so that the zero (high-frequency) coefficients tend to be clustered at the end of the list (302); coding the list of coefficients as a sequence of (run, level) pairs (306); assigning a codeword to each pair according to a code such as a Huffman code (308); and using a single reserved codeword to signify the "end of block" condition, that is, the condition that all nonzero coefficients in the block have already been coded (406,408).

The run component of each pair is the length of a run of zero coefficients in the coefficient ordering, and the level is the actual value of the next nonzero coefficient. Each possible (run, level) pair is mapped by a fixed, previously determined mapping to a codeword based on a variable length prefix-free code (e.g., a Huffman code). One codeword 406 of the code is reserved for the "end-of-block" indicator 408, meaning that there are no more nonzero coefficients in the block.

There are deficiencies in transform coding. The method requires careful tuning of the coder. The following entities need to be carefully designed and matched to each other: (1) the coefficient ordering; (2) the variable length code; and (3) the matching of (run, level) pairs and the end-of-block condition to codewords. In addition, related coding schemes fail to take advantage of correlations between coefficients other than those implied by the fixed coefficient ordering. Further, the use of prefix-free codes means that some compression inefficiency is inevitable.

Next, this disclosure discusses arithmetic coding with reference to FIG. 5 Arithmetic coding is a method of coding according to which a sequence of events, each with its own probability distribution, is coded, each event using the smallest number of bits theoretically possible given the probability of the event. This number of bits is not restricted to being an integer. An arithmetic coder retains state information between events, and makes use of this state information to allow coding multiple events with a single bit, and to allow the coding for a single event to extend over one or more full or partial bits.

FIG. 5 illustrates an example arithmetic encoder. The encoder contains probability distributions 501, 502, 503, . . . , 504 for all possible events that can occur in different contexts $C_1, C_2, C_3, \ldots, C_N$. An event 510 is input to the coder, along with its associated context identifier 520. A selector 530 selects one of the stored probability distributions 532 based on the context identifier. The arithmetic entropy coder 540 transforms the event, the selected probability distribution, and the internal state of the arithmetic coder 550 into a sequence of bits 560 to be output to the channel for transmission to the decoder. The internal state 550 and the selected probability distribution are updated.

A theoretical arithmetic coder uses unlimited precision arithmetic, and is not practical. In the related art there are a number of "approximate arithmetic coders." These are approximate in the sense that the number of output bits is nearly theoretically optimal, but not exactly so. The result of coding and decoding is a complete and exact reconstruction of the original sequence of events; it is not "approximate" in any sense. The term "arithmetic coding" invariably refers to use of an approximate arithmetic coder.

Many approximate arithmetic coders are designed to code binary events, that is, events that can have one of only two possible values. It is a trivial and obvious use of a binary arithmetic coder to code non-binary events by decomposing the non-binary events into a sequence of binary decisions, each coded as a binary event by a binary arithmetic coder.

What is needed in the art is an improvement image coding and decoding.

SUMMARY OF THE INVENTION

What is needed in the art is a transform coding technique and transform decoding technique that do not have to be tuned for all possible images ahead of time. An adaptive arithmetic coder handles that requirement. Further improved coding and decoding efficiency may be achieved by removing the need for an end-of-block signal. These and other advantages are provided according to the present invention.

An exemplary embodiment of the invention relates to a method of using pattern vectors for image coding. A computer device performs the method, as will be understood by those of skill in the art. With reference to FIG. 6, the method comprises converting a block of image data into an array of transform coefficients (602) and quantizing the transform coefficients such that all, some, or none of the coefficients become zero (604). The method for coding image data further comprises constructing a bit vector indicating which coefficients are non-zero (606), and coding the bit vector as an integer using an arithmetic coder (608). The step of coding the bit vector may be accomplished using an adaptive arithmetic coder, semi-adaptive arithmetic coder or a non-adaptive arithmetic coder. The computer device codes the values of the coefficients in any fixed order, using an adaptive, semi-adaptive, or non-adaptive arithmetic coder.

Another embodiment of the invention relates to a method of decoding a bitstream coded according to the above-mentioned method. This embodiment comprises a method of decoding coded data comprising: decoding a bit vector coded as an integer using an arithmetic decoder wherein the values of the transform coefficients are decoded in any fixed order, deconstructing the bit vector to determine which coefficients are non-zero, dequantizing the transform coefficients to determine whether all, some or none of the coefficients are zero, converting the dequantized transform coefficients into block image data.

The number of coefficients transformed to zero depends on the image block itself and the quantization step size. The coarser the quantization, that is, the larger the quantization step size, the more coefficients become 0 and the worse the reconstructed image looks. For typical images, the energy compaction properties of the DCT often cause the high frequency coefficients to be smaller than the low frequency coefficients. A typical image contains hundreds, or even thousands, of blocks, and a typical video segment contains tens of images every second. Effective compression depends on the fact that, on average, many of the transform coefficients for many of the blocks are zero, and can be transmitted with very few bits. The essence of the present invention is a new and better method of using a very small number of bits to indicate the zero coefficients.

BRIEF DESCRIPTION OF THE DRAWINGS

The foregoing advantages of the present invention will be apparent from the following detailed description of several embodiments of the invention with reference to the corresponding accompanying drawings, in which:

FIG. 3 illustrates a known method of converting an array of quantized transform coefficients for one block into part of a bitstream;

FIG. 4 illustrates an example of part of a mapping between (run, level) pairs and codewords from a prefix-free code;

DETAILED DESCRIPTION OF THE INVENTION

Figure 6:
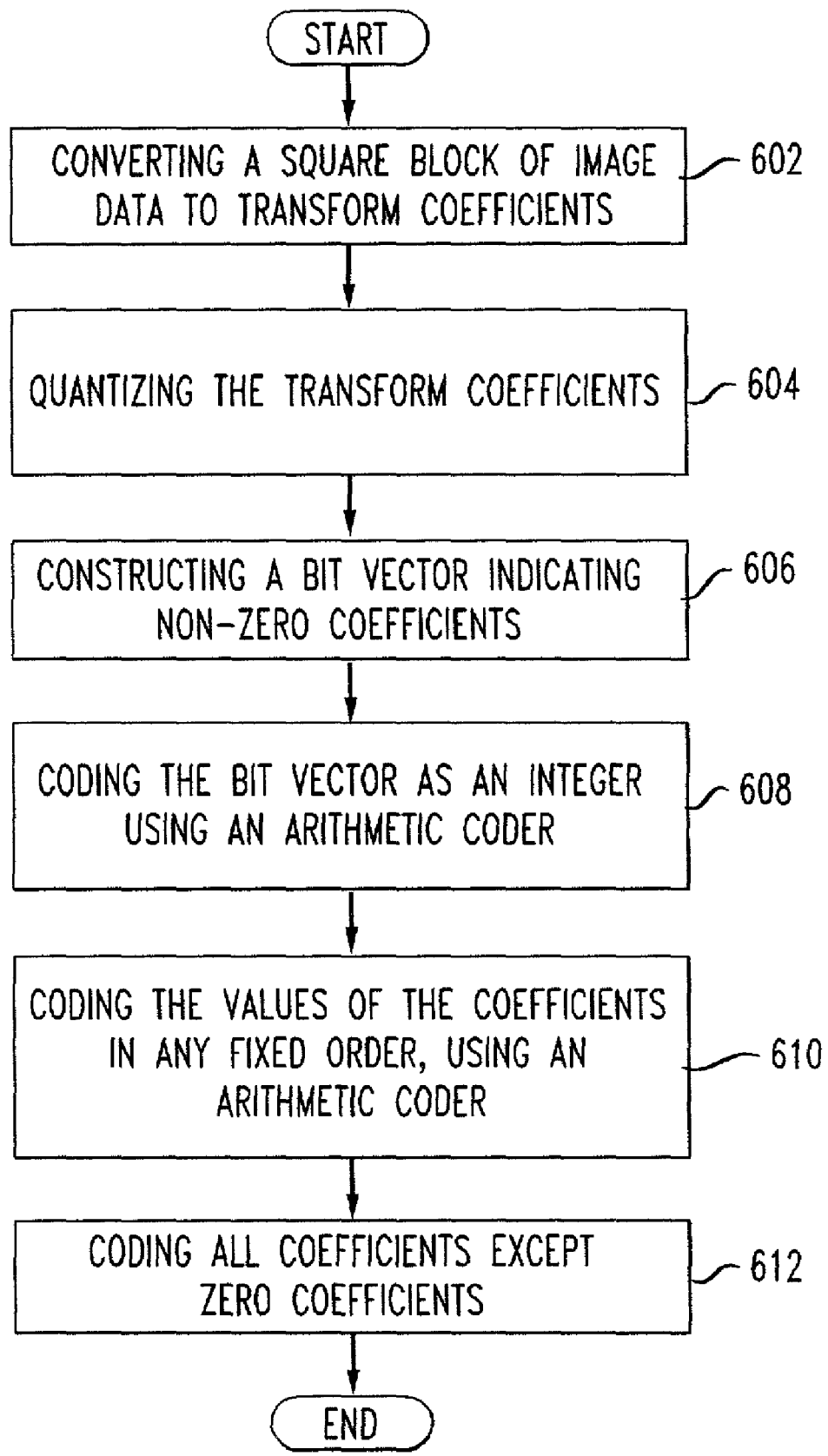
FIG. 6 illustrates a method of coding image data according to an embodiment of the present invention.

The present invention may be understood with reference to FIG. 6. FIG. 6 shows a sample method of using pattern vectors for image coding according to an aspect of the invention. The method may be performed by the hardware components known to those of skill in the art. The method comprises converting a block of image data into an array of transform coefficients (602) and quantizing the transform coefficients such that all, some or none of the coefficients become zero (604). The method further comprises constructing a bit vector indicating which coefficients are non-zero (606) and coding the bit vector as an integer using an adaptive, semi-adaptive or non-adaptive arithmetic coder (608). Those of skill in the art will be aware of such arithmetic coders. Here it is noted that although a bit vector is referenced, the core idea of the present invention does not necessarily require the use of a bit vector given that the invention's principle is that all the zero and non-zero coefficient information is combined into a single entity for coding. Any related data whose relationship is not clearly defined can be coded according to the principles of the present invention.

For example, in another aspect of the invention, a method of coding data not having a clearly defined relationship comprises converting the data into transform coefficients, quantizing the transform coefficients such that all, some or none of the transform coefficients become zero, constructing a single entity from the quantized transform coefficients, and coding the single entity using an arithmetic coder wherein the values of the transform coefficients are coded in any fixed order. One example of the single entity is the bit vector discussed herein, but other entities may also be used.

Next, the method comprises coding the values of the coefficients in any fixed order, using an adaptive, semi-adaptive or non-adaptive arithmetic coder, or any other coder (610). Each coefficient is coded according to its own context, possibly based on which coefficient it is and possibly based on other factors. The method includes coding all coefficients except the zero coefficients indicated above (612).

Figure 7:
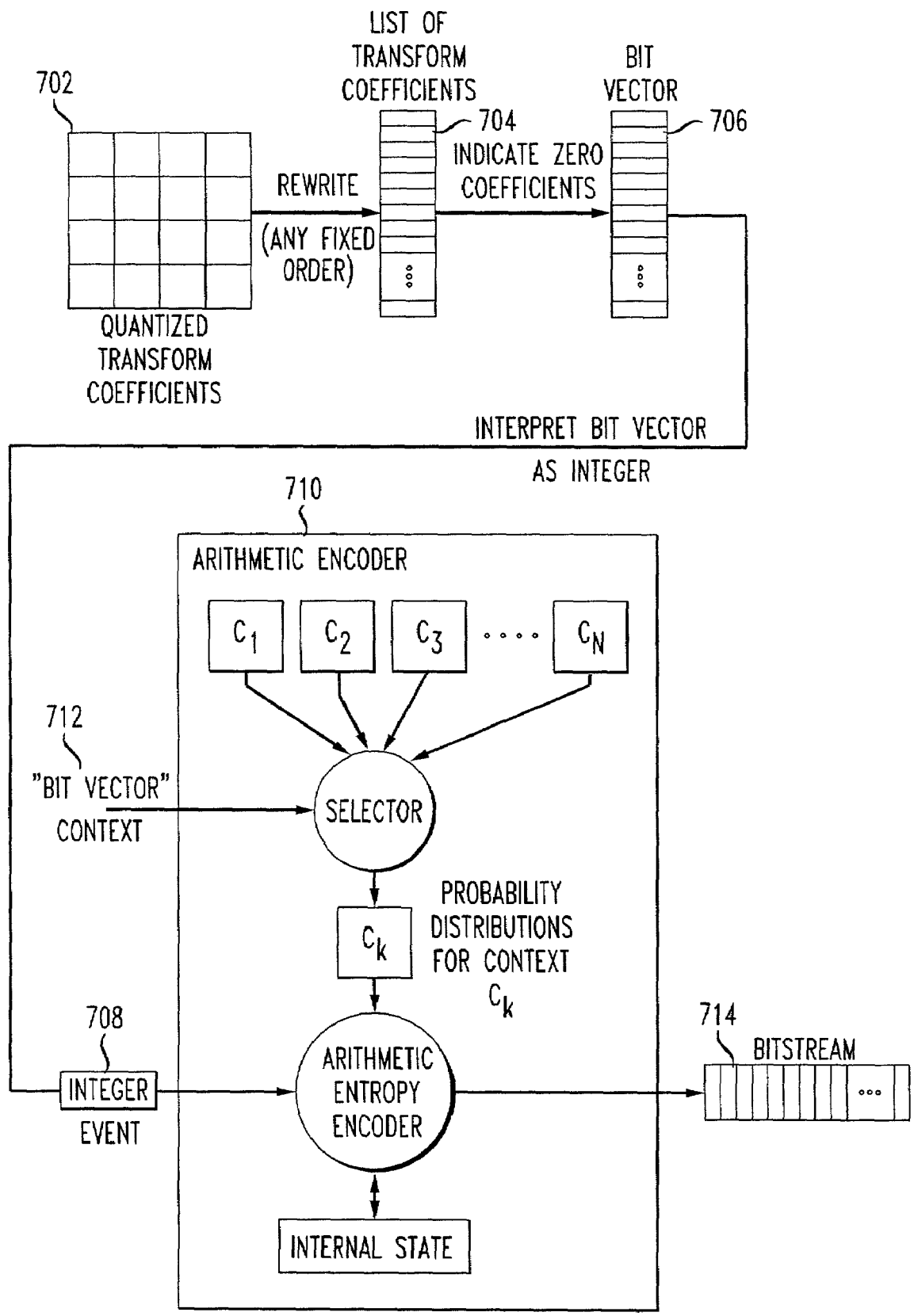
FIG. 7 illustrates an example method of coding zero transform coefficients according to the present invention.
Figure 8:
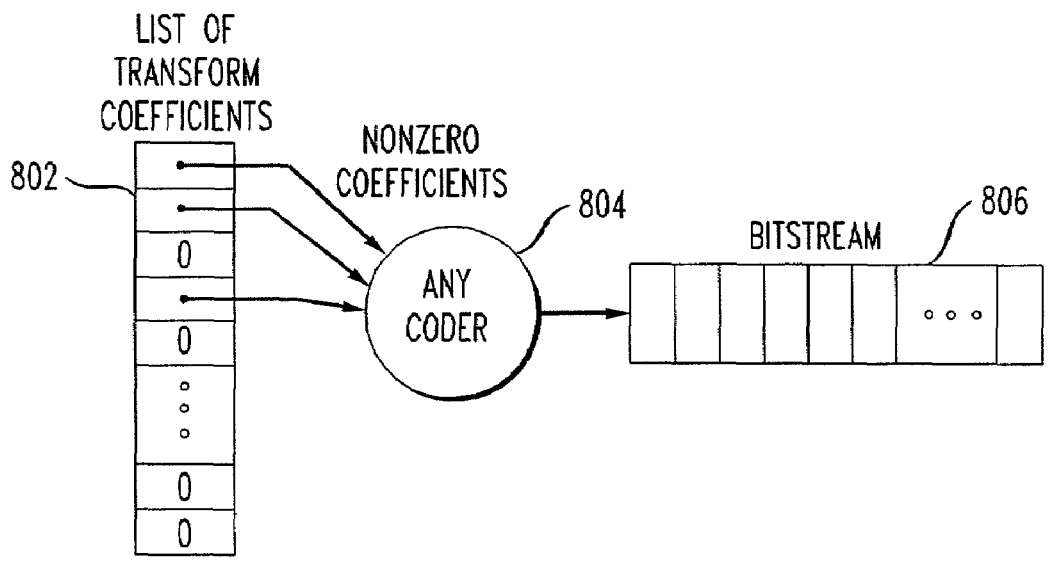
FIG. 8 illustrates an example method of coding nonzero transform coefficients according to the present invention.

The novel steps of the invention are further illustrated in FIG. 7 and FIG. 8. FIG. 7 illustrates the construction and coding of the single entity or bit vector. Conceptually, a computer device rewrites the array of transform coefficients 702 as a list of transform coefficients 704. The method according to the present invention will be operated on a computer device having a processor operating a program of instructions to perform the data coding operations disclosed herein. Any number of computer devices may be used and such various computer devices are known to those of skill in the art and thus not illustrated.

Figure 1:
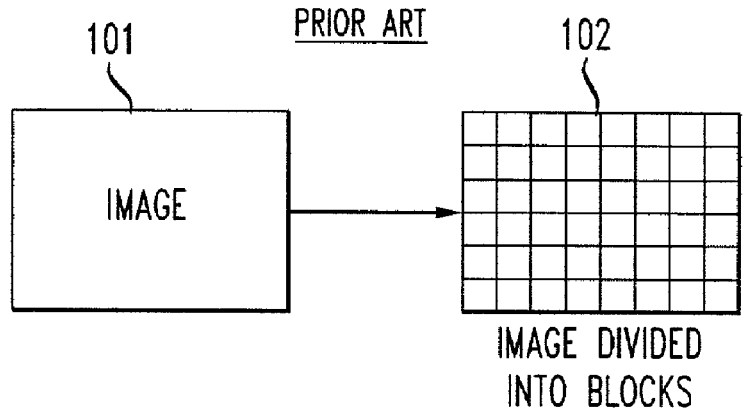
FIG. 1 illustrates an operation of dividing an image into a group of blocks.
Figure 2:
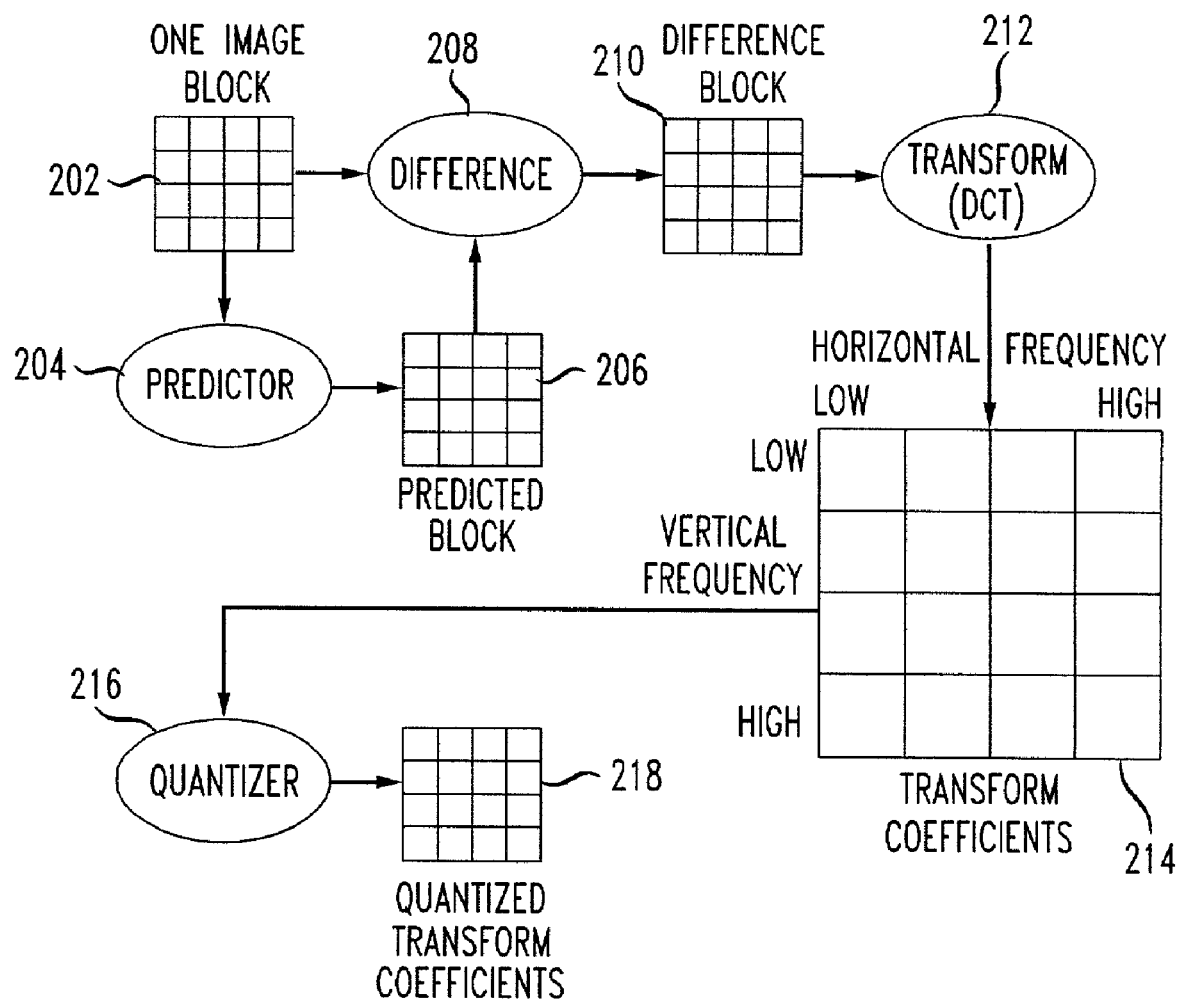
FIG. 2 illustrates a known sequence of operations in image and video coding to convert one block of an image or video frame into an array of quantized transform coefficients.
Figure 5:
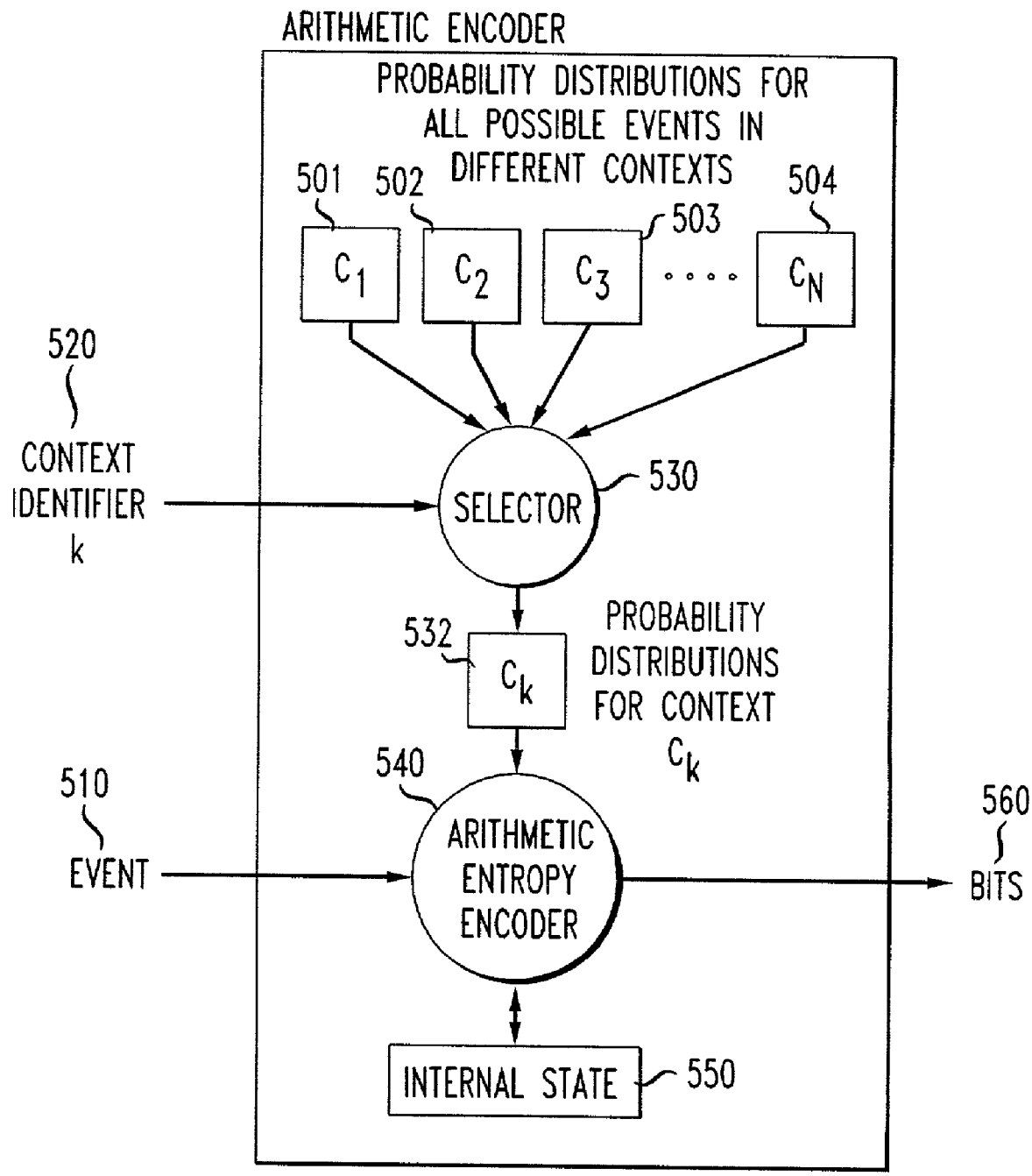
FIG. 5 illustrates a known method for performing arithmetic encoding.

A bit vector 706 has the same number of bits as the number of coefficients in the transform coefficient list, and there is a one-to-one correspondence between coefficients in the coefficient list and bits in the single entity or bit vector. Setting each bit in the bit vector where the corresponding coefficient in the coefficient list is zero fills the bit vector. The bit vector is then reinterpreted as an integer 708. An arithmetic coder 710 encodes the integer 708, with the context being identified as the "bit vector" context 712. The arithmetic coder outputs bits to a bitstream 714. The arithmetic coder 710 is as described above and illustrated in FIG. 5.

The computer device codes the values of the nonzero coefficients in any fixed order, using any coder. The coder may be an adaptive, semi-adaptive or non-adaptive arithmetic coder, or it may be any other coder. Most arithmetic coders consist of both a probability estimation part and an entropy coding part. The probability distribution estimates for all events may be fixed ahead of time for all uses of the coder: an arithmetic coder with this property is called "non-adaptive." The probability distribution estimates for all events may be computed before a use of the coder, and transmitted to the decoder before coding commences; this distribution is then used for the entire use of the coder. An arithmetic coder with this property is called "semi-adaptive." The probability distribution estimates that the coder uses may change for some or all events during the use of the coder in such a way that the decoder can make the same changes to the probability distribution estimates. An arithmetic coder with this property is called "adaptive." In an adaptive arithmetic coder, it is possible to initialize one or more of the probability distribution estimates to some predetermined values. This often leads to faster adaptation. A typical use of an adaptive arithmetic coder is to always initialize all probability distributions to values that are typical for the type of data being coded, then during a given use of the coder to adapt the appropriate distributions after each event is coded. If the coefficients are coded using an arithmetic coder, each coefficient is coded according to its own context, possibly based on which coefficient it is and possibly based on other factors. All coefficients are coded except the zero coefficients indicated by the bit vector described above. FIG. 8 illustrates the coding of nonzero coefficients. The nonzero coefficients form a list of transform coefficients 802 are coded using any coder 804. The coder outputs bits to the bitstream 806.

Figure 9:
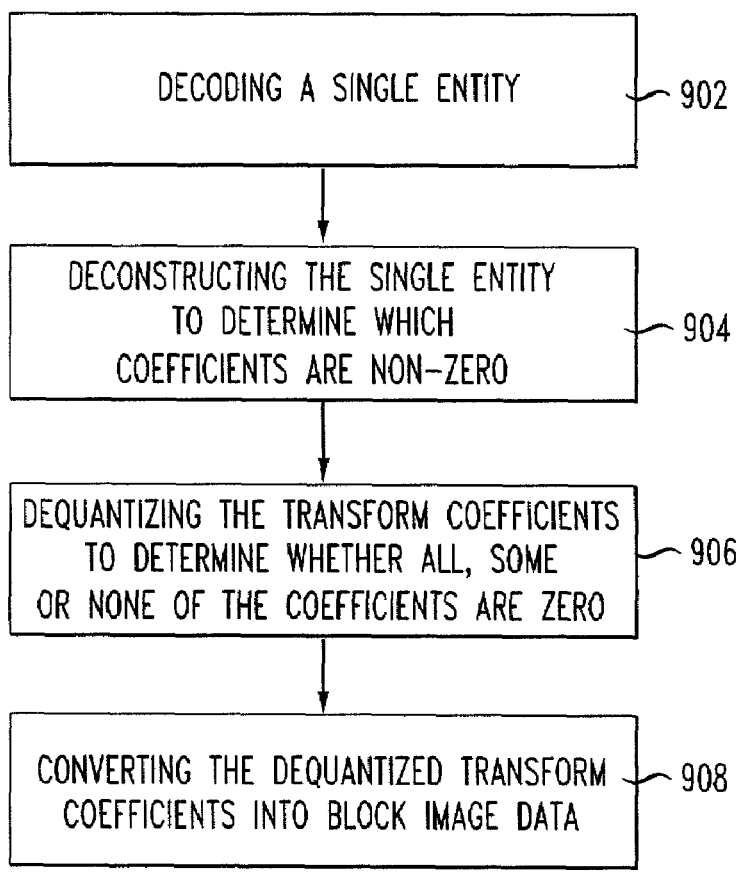
FIG. 9 illustrates an example method of decoding a bitstream generated according to an embodiment of the present invention.

Other embodiments of the invention include a computer device for practicing the method, a computer-readable medium for instructing a compute device to practice the method of the invention, a bitstream created according to a method of the present invention, and a decoder and decoder process for decoding a bistream generated according to an embodiment of the present invention. FIG. 9 illustrates an example method for decoding a bitstream. The bistream in this example was generated according to the embodiments of the invention described herein for generating a bitstream. The decoding method comprises decoding a single entity, such as the bit vector, wherein the values of transform coefficients are decoded in any fixed order (902), deconstructing the single entity to determine which coefficients are non-zero (904), dequantizing the transform coefficients to determine whether all, some or none of the coefficients are zero (906), and converting the dequantized transform coefficients into block image data (908).

An advantage of the present invention includes enabling a mechanical tuning of the encoder ahead of time, if desired. The mechanism is to operate the coder on a range of typical images or video sequences to obtain typical probability distributions for all events that can be coded, then to build these typical distributions into the coder and decoder as part of their initialization sequences. Thus no human intervention is necessary in the tuning process.

Another advantage of this invention is that the arithmetic coder automatically detects correlations among the various coefficients through the adaptation of the bit vector probability distributions. In addition, using arithmetic coding guarantees that almost no bits are wasted simply because of the limitations of prefix-free codes. These and other advantages will be apparent to those of skill in the art.

Although the above description contains specific details, they should not be construed as limiting the claims in any way. Other configurations of the described embodiments of the invention are part of the scope of this invention. For example, the principles of the present invention may be applied to allow coding of any related data, not just image data. There are many uses of arithmetic coding beyond image and video coding to which the fundamental principles of the present invention do apply. Accordingly, the appended claims and their legal equivalents should only define the invention, rather than any specific examples given.

I claim:

1. A method for coding image data, the method composing:
    converting a block of image data into transform coefficients;
    quantizing the transform coefficients such that all, some, or none of the transform coefficients become zero;
    constructing a single entity indicating which transform coefficients are non-zero; and
    coding the single entity as an integer using one of a semi-adaptive arithmetic coder or a non-adaptive arithmetic coder wherein the values of the transform coefficients are coded in any fixed order.

2. The method for coding image data of claim 1, wherein each transform coefficient is coded according to its own context, based on the transform coefficient.

3. The method for coding image data of claim 1, wherein the single entity is a bit vector.

4. A computer-readable medium having a stored computer program for controlling the operation of a computer device to perform data coding according to a method comprising the steps of:

converting a block of image data into transform coefficients;

quantizing the transform coefficients such that all, some, or none of the transform coefficients become zero;

constructing a single entity indicating which transform coefficients are non-zero; and coding the single entity as an integer using one of a semi-adaptive arithmetic coder or a non-adaptive arithmetic coder wherein the values of the transform coefficients are coded in any fixed order.

5. The computer-readable medium of claim 4, wherein the single entity is a bit vector.

6. A method of coding data not having a clearly defined relationship, the method comprising:

converting the data into transform coefficients;

quantizing the transform coefficients such that all, some or none of the transform coefficients become zero;

constructing a single entity from the quantized transform coefficients; and coding the single entity using one of a semi-adaptive arithmetic coder or a non-adaptive arithmetic coder wherein the values of the transform coded in any fixed order.

7. The method of claim 6, wherein the single entity is a bit vector.

8. A method of decoding a bitstream, the bitstream being coded using a single entity coded as an integer using one of a semi-adaptive arithmetic coder or a non-adaptive arithmetic coder, the method comprising:

decoding the single entity wherein the values of transform coefficients are decoded in any fixed order;

deconstructing the single entity to determine which coefficients are non-zero;

dequantizing the transform coefficients to determine whether all, some or none of the coefficients are zero; and converting the dequantized transform coefficients into block image data.

9. The method of decoding a bitstream of claim 8, wherein the single entity is a bit vector.

10. A computing device that codes an image, the computing device comprising:

a module configured to convert a block of image data into transform coefficients;

a module configured to quantize the transform coefficients such that all, some, or none of the transform coefficients become zero;

a module configured to construct a single entity indicating which transform coefficients are non-zero; and a module configured to code the single entity as an integer using one of a semi-adaptive arithmetic coder or a non-adaptive arithmetic coder wherein the values of the transform coefficients are coded in any fixed order.

11. The computing device of claim 10, wherein the single entity is a bit vector.

* * * * *